United States Patent [19]

Fey

[11] 4,102,766

[45] Jul. 25, 1978

[54] PROCESS FOR DOPING HIGH PURITY SILICON IN AN ARC HEATER

[75] Inventor: Maurice G. Fey, Plum Borough, Pa.

[73] Assignee: Westinghouse Electric Corp., Pittsburgh, Pa.

[21] Appl. No.: 787,634

[22] Filed: Apr. 14, 1977

[51] Int. Cl.² .................. B01K 1/00; C01B 33/00; C04B 35/00; H01L 3/06
[52] U.S. Cl. .................. 204/164; 252/62.3 E; 423/350
[58] Field of Search ............ 204/164; 423/350; 252/62.3 E

[56] References Cited

U.S. PATENT DOCUMENTS

| | | | |
|---|---|---|---|
| 2,172,969 | 9/1939 | Eringer | 423/350 |
| 3,192,083 | 6/1965 | Sirtl | 148/175 |
| 3,212,922 | 10/1965 | Sirtl | 148/174 X |
| 3,649,497 | 3/1972 | Kugler et al. | 204/164 |
| 3,915,764 | 10/1975 | Noreika et al. | 148/175 |

Primary Examiner—F.C. Edmundson
Attorney, Agent, or Firm—L. P. Johns

[57] ABSTRACT

A method for doping solar grade silicon characterized by the steps of feeding into an arc heated gas stream a quantity of a metal reductant such as an alkali metal or an alkaline-earth metal and also feeding into the stream a quantity of a silicon halide and of a corresponding halide of a doping agent such as arsenic to react with the metal reductant to produce reaction products including a salt of a metal reductant and a mixture of liquid silicon and doping agent, and separating the mixture from the salt of the metal reductant.

5 Claims, 3 Drawing Figures

PROCESS FOR DOPING HIGH PURITY SILICON IN AN ARC HEATER

CROSS-REFERENCE TO RELATED APPLICATIONS

This application is related to the applications Ser. No. 757,545, filed Jan. 6, 1977 by F. J. Harvey II; Ser. No. 757,546, filed Jan. 6, 1977 by M. G. Fey and F. J. Harvey II; and Ser. No. 787,635, filed Apr. 14, 1977 by M. G. Fey, F. J. Harvey II, and Robert Mazelsky.

BACKGROUND OF THE INVENTION

1. Field of the Invention

This invention relates to a method for doping solar grade silicon using an electric arc heater.

2. Description of the Prior Art

Heretofore, high purified silicon-tetrachloride ($SiCl_4$) gas and a reducing agent, such as sodium or magnesium, were heated in the reaction zone of a high temperature electric arc heater by a high temperature gas such as mixtures of hydrogen and argon for silicon production. The metal reducing agent reacted with the silicon-tetrachloride to form molten silicon and a gaseous metal chloride. The silicon product was then separated from the gases in a cyclonic chamber with the silicon being removed from the bottom of the chamber for further processing while the gases were removed from the top of the chamber for recycling. One of the initial steps in silicon processing after removal from the collection chamber was to heat or remelt the silicon in a crucible under controlled atmospheric conditions, so that a doping agent, such as arsenic, could be added to the melt. The disadvantage of that process was that time was required for uniform dispersion of the dopant in the melt before further processing could begin. Moreover, extra energy was required to remelt the silicon.

SUMMARY OF THE INVENTION

It has been found in accordance with this invention that the foregoing disadvantage can be overcome by a method for doping solar grade silicon comprising the steps of providing an arc heater having spaced electrodes and forming an arc chamber communicating with the reaction chamber, striking an electric arc in an axial gap between the electrodes, introducing an arc gas selected from the group consisting of hydrogen and a mixture of hydrogen and an inert gas through the gap to provide an elongated stream extending into the reaction chamber, feeding into the arc stream a quantity of a metal reductant selected from the group consisting of an alkali metal and an alkaline-earth metal, feeding into the arc stream a quantity of silicon halide and of a corresponding halide of a doping agent selected from the group consisting of arsenic, aluminum, antimony, boron, bismuth, copper, gallium, indium, iron, lithium, nickel, phosphorous, and zinc, to react with the metal reductant to produce reaction products including a salt of the metal reductant and a mixture of liquid silicon and doping agent, and separating the mixture of the liquid silicon and doping agent from the salt.

The advantage of the method of this invention is the provision of an improved silicon doping procedure in a simplified, less time consuming, and less costly manner. Moreover, a more uniform dispersion of the dopant in the silicon is automatically achieved without additional heating or remelting. Finally, early silicon doping has the advantage of continuously casting of single crystal rods or strips at the exit end of a cyclonic collection chamber which further simplifies and shortens the time requirements of the normal downstream processing which may include slow drawing of a single crystal from an induction heated molten bath.

DESCRIPTION OF THE PREFERRED EMBODIMENT

In accordance with this invention the process comprises the following steps:

(a) providing an arc heater having spaced electrodes and forming an arc chamber communicating with a reaction chamber;

(b) striking an electric arc in an axial gap between the electrodes;

(c) introducing an arc gas selected from the group consisting of hydrogen and a mixture of hydrogen and an inert gas through the gap to provide an elongated arc stream extending into the reaction chamber;

(d) feeding into the arc stream a quantity of metal reductant selected from the group consisting of an alkali metal and an alkaline-earth metal;

(e) feeding into the arc stream a quantity of silicon halide and of a corresponding halide of a doping agent selected from the group consisting of arsenic, aluminum, antimony, boron, bismuth, copper, gallium, indium, iron, lithium, nickel, phosphorous, and zinc, to react with the metal reductant to produce reaction products including a salt of the metal reductant and a mixture of the liquid silicon and doping agent, and (f) separating the mixture of the liquid silicon and doping agent from the salt.

Although the foregoing process discloses the introduction of hydrogen with or without an inert gas such as argon at step (c), and the use of a metal reductant such as sodium or magnesium at step (d), it is understood that either step (c) or (d) may be omitted by using a metal reductant or hydrogen as alternatives for reducing the silicon halide ($SiCl_4$) to liquid silicon status. However, the preferred method is to use both hydrogen and a metal reductant, because the process is more efficient. For example, where hydrogen alone is used to the exclusion of a metal reductant, inordinate amounts of hydrogen are required.

Figure 1:
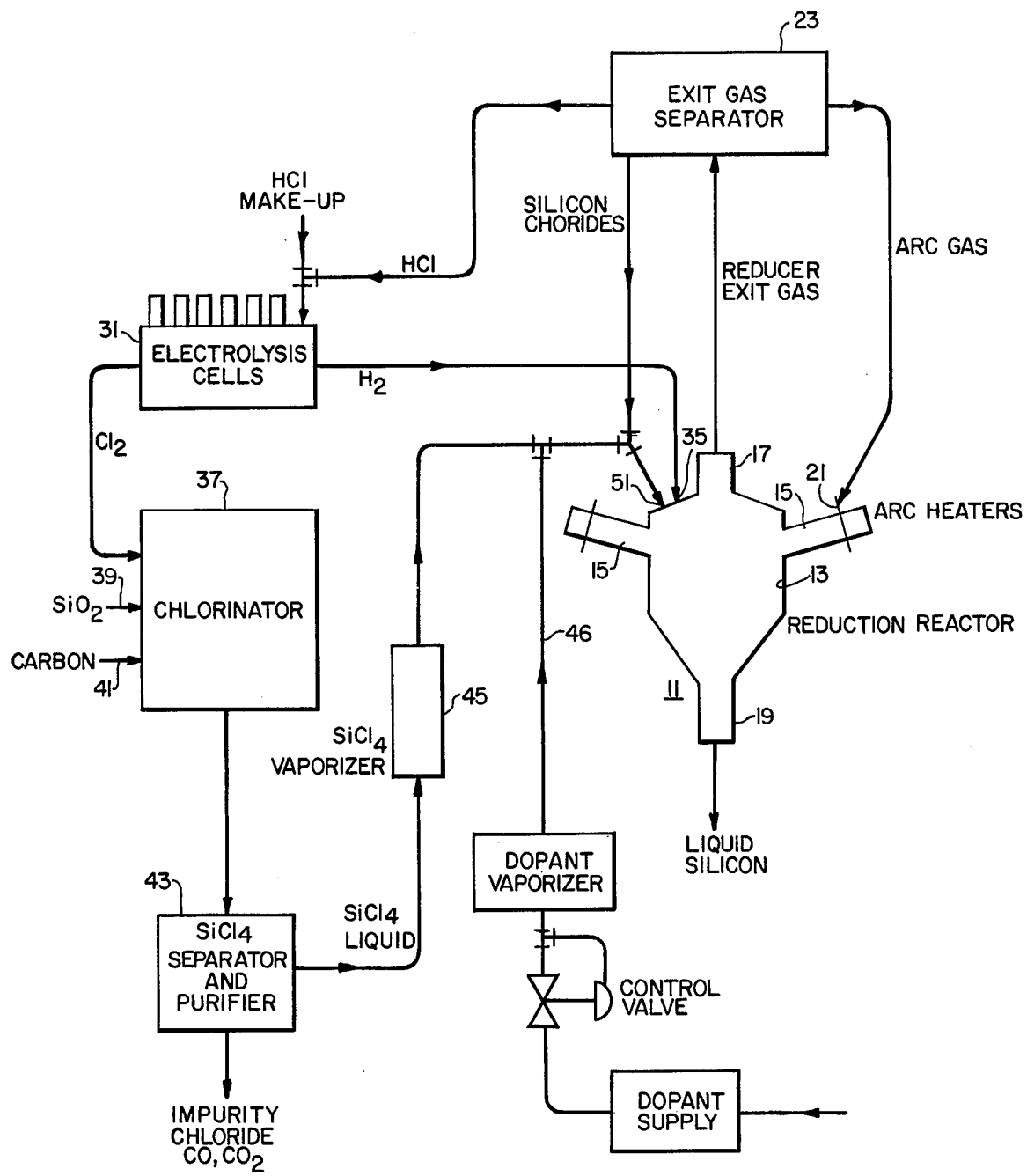
FIG. 1 is a flow diagram.

The means for performing that process are disclosed diagrammatically in FIG. 1 and comprise a reactor generally indicated at 11 which is supported by associated structures including a reaction chamber 13, at least one and preferably a plurality of arc heaters 15, a first vent or outlet means 17 for coproduct gases, and second vent or outlet means 19 for liquid silicon.

The arc gas is introduced into the system at 21 through the arc heaters 15 as will be set forth more particularly below. The arc gas together with the other coproducts including HCl(g) leave the reactor through the outlet means 17 and are connected to a cyclone type separator 23 for separating the arc gas and the HCl, the former of which is redirected into the arc heaters at inlet 21. The HCl leaves the separator 23 from where it is conducted to an electrolysis cell 31 for disassociation into hydrogen and chlorine. The hydrogen is transmitted to inlet 35 where it is introduced into the reactor 11. The chlorine from cell 31 is conducted to a chlorinator 37 where, together with a silica bearing material, it is introduced at inlet 39. A carbonaceous material, such as coke, is introduced at inlet 41 to react with the chlorine to produce silicon tetrachloride, impurity chlorides, and oxides of carbon. The mixture of gases that are produced in the chlorination proceed to the separator 43 where the silicon tetrachloride is purified. The silicon tetrachloride is moved to the vaporizer 45 and then to the reactor 11 at inlet 51. The dopant may be introduced into inlet 51 by a conduit 46, or downstream at 85 as set forth below (FIG. 2).

Figure 2:
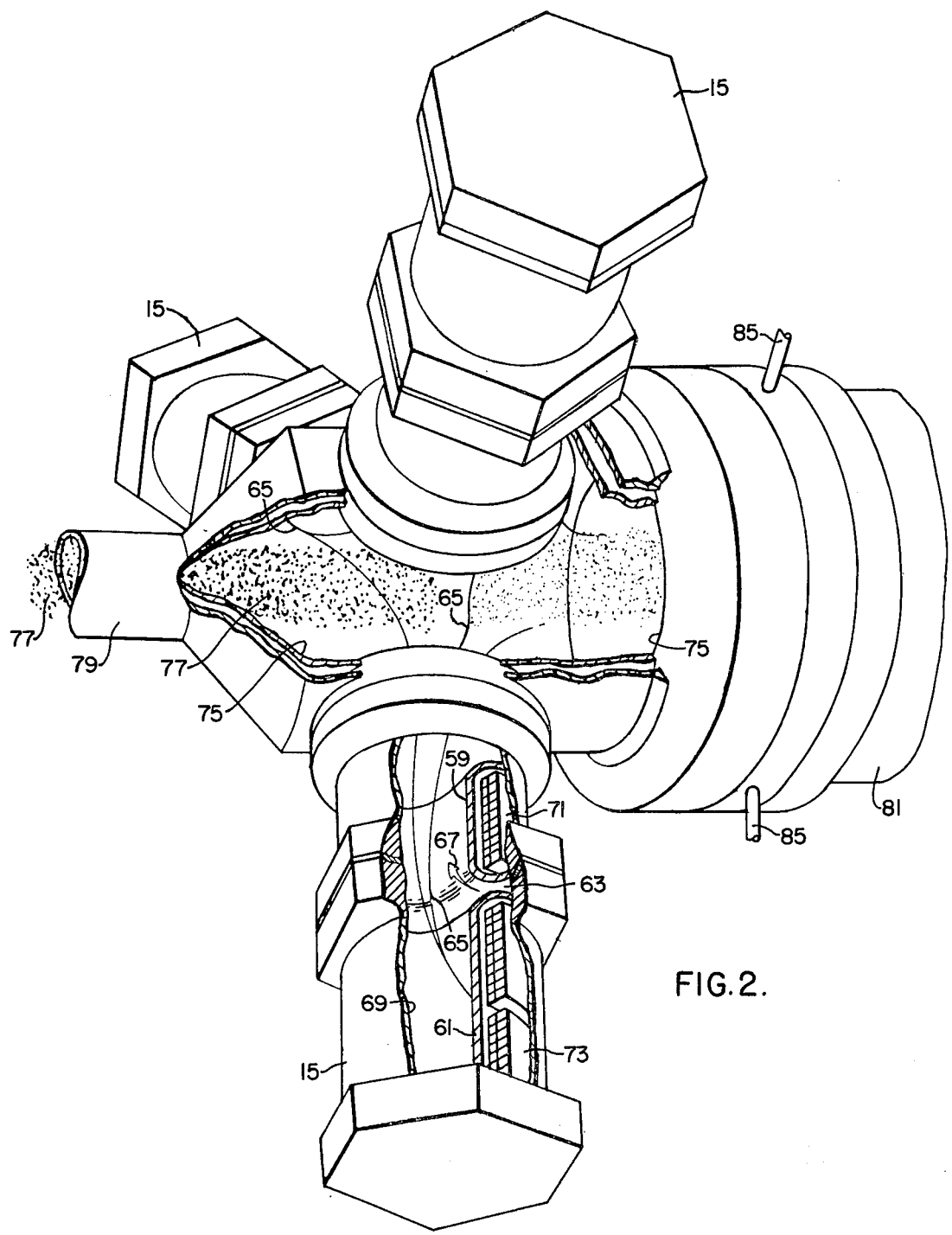
FIG. 2 is an elevational view, partially in section, of an arc heater.

As shown in FIG. 2, one or more and preferably three arc heaters 15 are similar in construction and operation to that disclosed in U.S. Pat. No. 3,765,870, entitled "Method Of Direct Or Reduction Using A Short Gap Arc Heater" of which the inventors are M. G. Fey and George A. Kemeny. Because of the full disclosure in that patent, the description of the arc heaters 15 is limited herein to the basic structure and operation. The arc heaters 15 (FIG. 2) are each a single phase, self-stabilizing AC device capable of power levels up to about 3500 kilowatts, or up to about 10,000 kilowatts for a three phase plant insulation. In the practice of this invention, it is preferred that three arc heaters be provided, one for each of the three phases of the AC power supply.

The arc heater 15 has two annular copper electrodes 59, 61 which are spaced at 63 about 1 millimeter apart to accommodate a line frequency power source of about 4 kV. An arc 65 occurs in the space or gap 63 and incoming feed stock gas 67 immediately blows the arc 65 from the space into the interior of the arc chamber 69. The feed stock gas 67 must be compatible with the silicon and may be one of the gases selected from the group consisting of inert gas, hydrogen, silicon halides, and mixtures thereof. The arc 65 rotates at a speed of about 1000 revolutions per second by interaction of the arc current (several thousands amps AC) with a DC magnetic field set up by externally mounted field coils 71, 73. The velocities yield a very high operating efficiency for equipment of this type and the elongated arc 65 is ultimately projected by the gas downstream toward and possibly into the reaction chamber 13. Feed stock material is introduced through inlet ports 35, 51, which are preferably downstream of the electrode 61 so that the materials enter into the elongated arc 65 as shown in FIG. 2.

The reacting materials are halides of silicon, a reductant metal of the alkali or alkaline-earth metals, such as sodium and magnesium, and hydrogen. Although the preferred silicon halide is silicon tetrachloride, any other halide such as silicon tetrabromide, may be used.

In addition, in accordance with this invention a dopant, such as arsenic tetrachloride, is added preferably with the silicon tetrachloride in desired proportions, such as, of the order of a few parts per million of arsenic to silicon. The materials react in accordance with the following formulas:

$$SiCl_4 + 4Na + H_2 \rightarrow Si + 4NaCl + H_2 \quad (1)$$

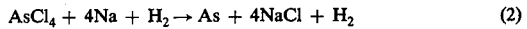

$$AsCl_4 + 4Na + H_2 \rightarrow As + 4NaCl + H_2 \quad (2)$$

The foregoing formulas are exemplary of the number of possibilities available for producing high purity or solar cell silicon which is doped with arsenic, it being understood that silicon and arsenic may be introduced either as a chloride or bromide which react with sodium or any other alkali or alkaline-earth metal to produce the high purity solar grade silicon comprising the desired amount of dopant, such as arsenic.

The reactor system, comprising the three arc heaters 15 (FIG. 2), directs the arc 15 into a reactor or plenum chamber 75 into which the reductant metal 77, such as sodium, is injected, preferably as a liquid spray through an inlet 79. Within the chamber 75 the metal 77 enters into the arc 65 where it combines with the feed stock gas 67 which is preferably a mixture of hydrogen and argon, from where it is propelled downstream (to the right as viewed in FIG. 2).

Figure 3:
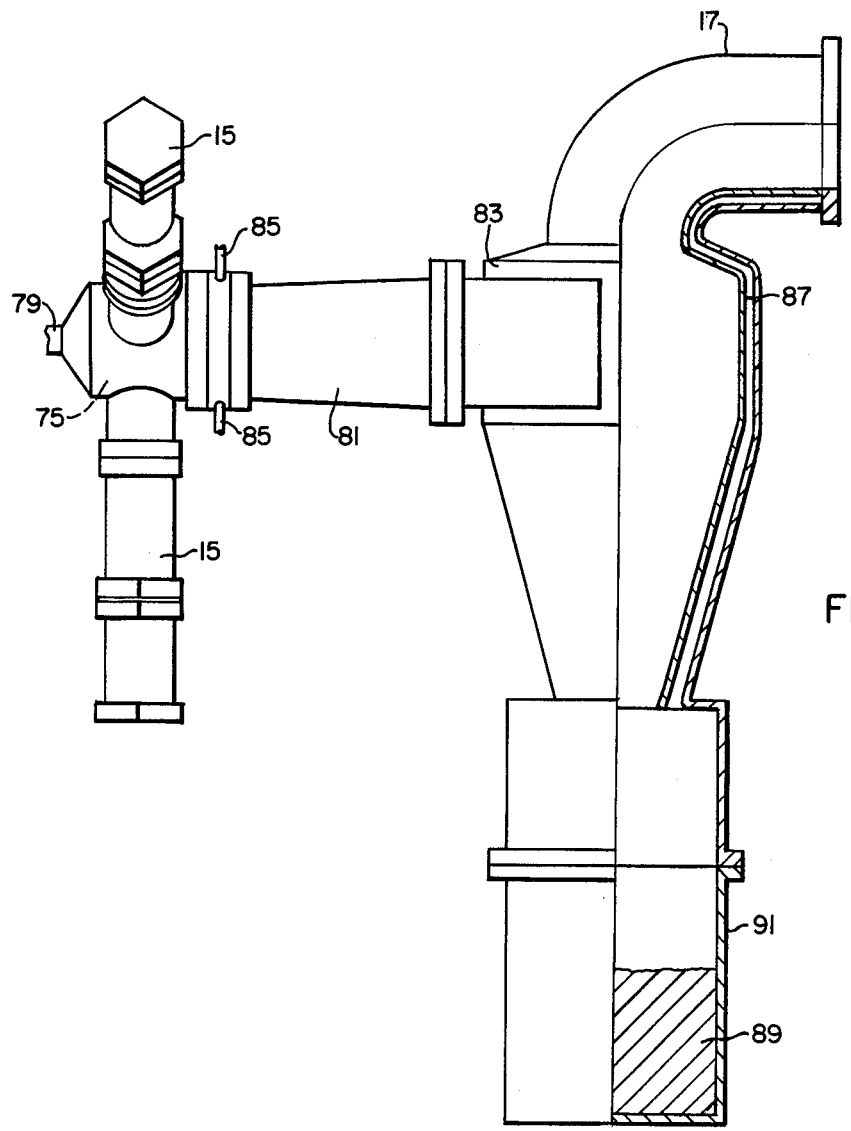
FIG. 3 is a perspective view with broken-away portions showing a three-phase arc heater system.

As shown in FIG. 3 the reaction chamber 75 is connected by an extension 81 to a cyclone separator 83. Inlet means, such as inlets 85, are provided downstream of the chamber 75, such as between the chamber and the extension 81, for injection of the silicon halide together with the required amount of dopant such as arsenic tetrachloride. Within the extension 81 the silicon and arsenic halides combine with the sodium and hydrogen in accordance with the formulas (1) and (2). Thus, the doping agent is reduced and is automatically uniformly dispersed within the resulting liquid silicon.

The resulting products of the above reactions are projected tangentially into the cyclone separator 83 from where the gaseous products including sodium chloride and hydrogen are exhausted through the outlet means 17. The liquid silicon collects on a liner 87 within the separator and flows downwardly to the lower end where it collects to form a silicon ingot 89 within a mold 91.

Accordingly, the improved silicon doping procedure of this invention accomplishes doping in a simplified and less costly manner. Uniform dispersion of the dopant in silicon is automatically accomplished without additional heating or remelting of the silicon.

What is claimed is:

1. A method for doping solar grade silicon comprising the steps of:
   (a) providing an arc heater having spaced tubular electrodes and forming an arc chamber communicating with a reaction chamber,
   (b) striking an electric arc in a gap between the electrodes,
   (c) feeding into the arc stream a quantity of a metal reductant selected from the group consisting of an alkali metal and an alkaline-earth metal,
   (d) feeding into the arc stream a quantity of silicon halide and of a corresponding halide of a doping agent selected from the group consisting of arsenic, aluminum, antimony, boron, bismuth, copper, gallium, indium, iron, lithium, nickel, phosphorous, and zinc, to react with the metal reductant to produce reaction products including a salt of the metal reductant and a mixture of liquid silicon and doping agent, and
   (e) separating centrifugally the mixture of liquid silicon and doping agent from the salt.

2. The method of claim 1 wherein the silicon halide and doping agent are introduced in gaseous form.

3. The method of claim 1 wherein silicon halide and doping agent are chlorides.

4. The method of claim 1 wherein the doping agent is introduced at a location where the silicon is reduced.

5. The method of claim 1 wherein an arc gas selected from the group consisting of hydrogen and a mixture of hydrogen and an inert gas is introduced through the gap to provide an elongated arc stream extending into the reaction chamber.

* * * * *